(12) United States Patent
McReynolds

(10) Patent No.: US 6,425,972 B1
(45) Date of Patent: *Jul. 30, 2002

(54) METHODS OF MANUFACTURING MICROFABRICATED SUBSTRATES

(75) Inventor: Richard J. McReynolds, San Jose, CA (US)

(73) Assignee: Calipher Technologies Corp., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/244,703

(22) Filed: Feb. 4, 1999

Related U.S. Application Data (63) Continuation-in-part of application No. 08/877,843, filed on Jun. 18, 1997, now Pat. No. 5,882,465.

(51) Int. Cl.⁷ .............................................. B29C 65/00
(52) U.S. Cl. .................... 156/285; 156/286; 156/308.2; 156/309.9; 438/113; 438/455; 438/458; 438/460; 438/462
(58) Field of Search ......................... 156/87, 104, 285, 156/286, 309.9, 308.2; 428/137, 138, 167, 172; 216/33, 34; 438/110, 113, 455, 458, 460, 462

(56) References Cited

U.S. PATENT DOCUMENTS

| | | | |
|---|---|---|---|
| 3,654,012 A | | 4/1972 | Schlager |
| 4,016,855 A | * | 4/1977 | Mimata .................... 125/13 R |
| 4,312,694 A | | 1/1982 | Sherman et al. |
| RE32,572 E | * | 1/1988 | Hawkins et al. ............ 156/626 |
| 5,304,487 A | | 4/1994 | Wilding et al. |
| 5,427,946 A | | 6/1995 | Kricka et al. |
| 5,486,335 A | | 1/1996 | Wilding et al. |
| 5,498,392 A | | 3/1996 | Wilding et al. |
| 5,699,157 A | | 12/1997 | Parce |
| 5,779,868 A | | 7/1998 | Parce et al. |
| 5,788,814 A | | 8/1998 | Sun et al. |
| 5,800,690 A | | 9/1998 | Chow et al. |
| 5,842,787 A | | 12/1998 | Kopf-Sill et al. |
| 5,852,495 A | | 12/1998 | Parce |
| 5,869,004 A | * | 2/1999 | Parce et al. .................. 422/100 |
| 5,876,675 A | | 3/1999 | Kennedy |
| 5,880,071 A | | 3/1999 | Parce et al. |
| 5,882,465 A | * | 3/1999 | McReynolds ................ 156/285 |
| 5,885,470 A | * | 3/1999 | Parce et al. .................... 216/33 |
| 5,942,443 A | | 8/1999 | Parce et al. |
| 5,948,227 A | | 9/1999 | Dubrow |
| 5,955,028 A | | 9/1999 | Chow |
| 5,957,579 A | | 9/1999 | Kopf-Sill et al. |
| 5,958,203 A | | 9/1999 | Parce et al. |

(List continued on next page.)

FOREIGN PATENT DOCUMENTS

| | | |
|---|---|---|
| WO | WO 9405414 | 3/1994 |
| WO | WO 95/33846 | * 12/1995 |
| WO | WO 9604547 | 2/1996 |
| WO | WO 9702357 | 1/1997 |
| WO | WO 9955630 | 11/1999 |

OTHER PUBLICATIONS

AB–Manufacturing, Inc. Brochure for High Performance Table–Top Mask Alignment and Exposure Systems.
Gandhi, *VLSI Fabrication Principles*, Chapter 10 (1994).

*Primary Examiner*—Michael W. Ball
*Assistant Examiner*—Jessica Rossi
(74) *Attorney, Agent, or Firm*—Andrew L. Filler; Gulshan H. Shaver

(57) ABSTRACT

The present invention is directed to improved methods and apparatuses for manufacturing microfabricated devices, and particularly, microfluidic devices. In general the methods and apparatuses of the invention provide improved methods of bonding substrates together by applying a vacuum to the space between the substrates during the bonding process.

17 Claims, 4 Drawing Sheets

U.S. PATENT DOCUMENTS

| | | |
|---|---|---|
| 5,958,694 A | 9/1999 | Nikiforov |
| 5,959,291 A | 9/1999 | Jensen |
| 5,964,995 A | 10/1999 | Nikiforov et al. |
| 5,965,001 A | 10/1999 | Chow et al. |
| 5,965,410 A | 10/1999 | Chow et al. |
| 5,972,187 A | 10/1999 | Parce et al. |
| 5,976,336 A | 11/1999 | Dubrow et al. |
| 5,989,402 A | 11/1999 | Chow et al. |
| 6,000,243 A * | 12/1999 | Davidson et al. .............. 65/36 |
| 6,001,231 A | 12/1999 | Kopf-Sill |
| 6,004,515 A | 12/1999 | Parce et al. |
| 6,011,252 A | 1/2000 | Jensen |
| 6,012,902 A | 1/2000 | Parce |

\* cited by examiner

METHODS OF MANUFACTURING MICROFABRICATED SUBSTRATES

CROSS REFERENCE TO RELATED APPLICATION

This application is a continuation-in-part of U.S. patent application Ser. No. 08/877,843, filed Jun. 18, 1997, now U.S. Pat. No. 5,882,465, and incorporated herein by reference for all purposes.

BACKGROUND OF THE INVENTION

Microfabricated devices are used in a wide variety of industries, ranging from the integrated circuits and microprocessors of the electronics industry to, in more recent applications, microfluidic devices and systems used in the pharmaceutical, chemical and biotechnology industries.

Because of the extreme small scale of these devices, as well as the highly precise nature of the operations which they perform, the manufacturing of these microfabricated devices requires extremely high levels of precision in all aspects of fabrication, in order to accurately and reliably produce the various microscale features of the devices.

In a number of these disciplines, the manufacturing of these microfabricated devices requires the layering or laminating of two or more layers of substrates, in order to produce the ultimate device. For example, in microfluidic devices, the microfluidic elements of the device are typically produced by etching or otherwise fabricating features into the surface of a first substrate. A second substrate is then laminated or bonded to the surface of the first to seal these features and provide the fluidic elements of the device, e.g., the fluid passages, chambers and the like.

While a number of bonding techniques are routinely utilized in mating or laminating multiple substrates together, these methods all suffer from a number of deficiencies. For example, silica-based substrates are often bonded together using thermal bonding techniques. However, in these thermal bonding methods, substrate yields can often be extremely low, as a result of uneven mating or inadequate contact between the substrate layers prior to the thermal bonding process. Similarly, in bonding semi-malleable substrates, variations in the contact between substrate layers, e.g., resulting from uneven application of pressure to the substrates, may adversely affect the dimensions of the features within the interior portion of the device, e.g., flattening channels of a microfluidic device, as well as their integrity.

Due to the cost of substrate material, and the more precise requirements for microfabricated devices generally, and microfluidic devices, specifically, it would generally be desirable to provide an improved method of manufacturing such devices to achieve improved product yields, and enhanced manufacturing precision. The present invention meets these and a variety of other needs.

SUMMARY OF THE INVENTION

The present invention is generally directed to improved methods of manufacturing microfabricated devices, and particularly, microfluidic devices. In particular, in a first aspect, the present invention provides methods and apparatuses for bonding microfabricated substrates together. In accordance with the methods of the present invention, a first substrate is provided which has at least a first planar surface, a second surface opposite the planar surface, and a plurality of apertures disposed through the first substrate from the first surface to the second surface. A vacuum is applied to the apertures, while the first planar surface of the first substrate is mated with a first planar surface of the second substrate. The mating of these substrates is carried out under conditions wherein the first surface of the first substrate is bonded to the first surface of the second substrate. Such conditions can include, e.g., heating the substrates, or applying an adhesive to one of the planar surfaces of the first or second substrate.

In a related aspect, the present invention also provides an apparatus for manufacturing microfluidic devices in accordance with the methods described above. Specifically, such apparatus typically comprises a platform surface for holding a first substrate, the first substrate having at least a first planar surface and a plurality of holes disposed therethrough, and wherein the platform surface comprises a vacuum port connected to a vacuum source, for applying a vacuum to the plurality of holes. The apparatus also comprises a bonding system for bonding the first surface of the first substrate to a first surface of a second substrate.

DETAILED DESCRIPTION OF THE INVENTION

The present invention is generally directed to improved methods of manufacturing microfabricated substrates, and particularly, to improved methods of bonding together microfabricated substrates in the manufacture of microfluidic devices. These improved methods of bonding substrates are generally applicable to a number of microfabrication processes, and are particularly well suited to the manufacture of microfluidic devices.

As used herein, the term "microscale" or "microfabricated" generally refers to structural elements or features of a device which have at least one fabricated dimension in the range of from about 0.1 $\mu$m to about 500 $\mu$m. Thus, a device referred to as being microfabricated or microscale will include at least one structural element or feature having such a dimension. When used to describe a fluidic element, such as a passage, chamber or conduit, the terms "microscale," "microfabricated" or "microfluidic" generally refer to one or more fluid passages, chambers or conduits which have at least one internal cross-sectional dimension, e.g., depth, width, length, diameter, etc., that is less than 500 $\mu$m, and typically between about 0.1 $\mu$m and about 500 $\mu$m. In the devices of the present invention, the microscale channels or chambers preferably have at least one cross-sectional dimension between about 0.1 $\mu$m and 200 $\mu$m, more preferably between about 0.1 $\mu$m and 100 $\mu$m, and often between about 0.1 $\mu$m and 20 $\mu$m. Accordingly, the microfluidic devices or systems prepared in accordance with the present invention typically include at least one microscale channel, usually at least two intersecting microscale channels, and often, three or more intersecting channels disposed within a single body structure. Channel intersections may exist in a number of formats, including cross intersections, "T" intersections, or any number of other structures whereby two channels are in fluid communication.

The body structure of the microfluidic devices described herein typically comprises an aggregation of two or more separate layers which when appropriately mated or joined together, form the microfluidic device of the invention, e.g., containing the channels and/or chambers described herein. Typically, the microfluidic devices described herein will comprise a top portion, a bottom portion, and an interior portion, wherein the interior portion substantially defines the channels and chambers of the device.

Figure 1:
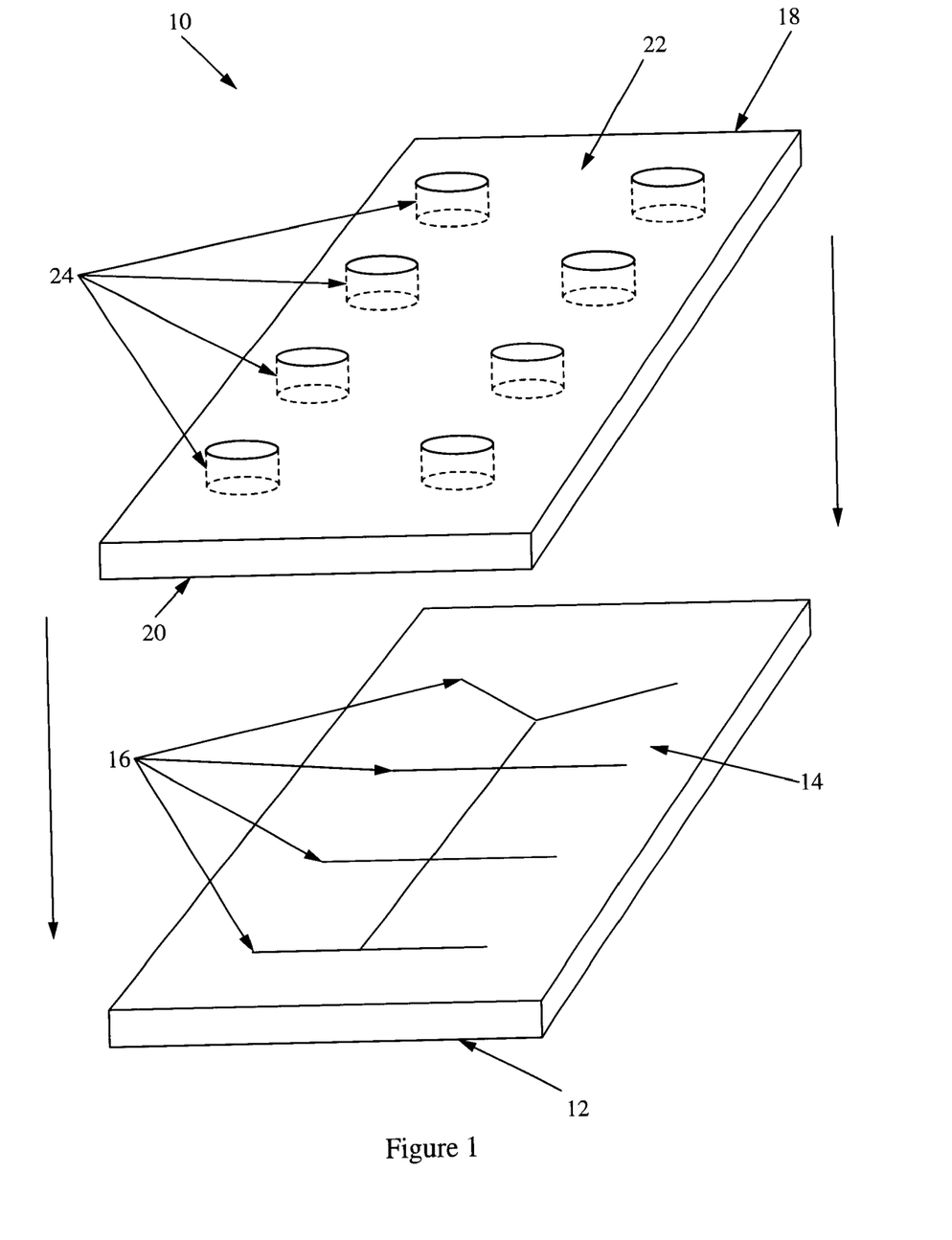
FIG. 1 illustrates the layered fabrication of a typical microfluidic device, from at least two separate substrates, which substrates are mated together to define the microfluidic elements of the device.

FIG. 1 illustrates a two layer body structure 10, for a microfluidic device. In preferred aspects, the bottom portion of the device 12 comprises a solid substrate that is substantially planar in structure, and which has at least one substantially flat upper surface 14. A variety of substrate materials may be employed as the bottom portion. Typically, because the devices are microfabricated, substrate materials will be selected based upon their compatibility with known microfabrication techniques, e.g., photolithography, wet chemical etching, laser ablation, air abrasion techniques, injection molding, embossing, and other techniques. The substrate materials are also generally selected for their compatibility with the full range of conditions to which the microfluidic devices may be exposed, including extremes of pH, temperature, salt concentration, and application of electric fields. Accordingly, in some preferred aspects, the substrate material may include materials normally associated with the semiconductor industry in which such microfabrication techniques are regularly employed, including, e.g., silica based substrates, such as glass, quartz, silicon or polysilicon, as well as other substrate materials, such as gallium arsenide and the like. In the case of semiconductive materials, it will often be desirable to provide an insulating coating or layer, e.g., silicon oxide, over the substrate material, and particularly in those applications where electric fields are to be applied to the device or its contents.

In additional preferred aspects, the substrate materials will comprise polymeric materials, e.g., plastics, such as polymethylmethacrylate (PMMA), polycarbonate, polytetrafluoroethylene (TEFLON™), polyvinylchloride (PVC), polydimethylsiloxane (PDMS), polysulfone, and the like. Such polymeric substrates are readily manufactured using available microfabrication techniques, as described above, or from microfabricated masters, using well known molding techniques, such as injection molding, embossing or stamping, or by polymerizing the polymeric precursor material within the mold (See U.S. Pat. No. 5,512,131). Such polymeric substrate materials are preferred for their ease of manufacture, low cost and disposability, as well as their general inertness to most extreme reaction conditions. Again, these polymeric materials may include treated surfaces, e.g., derivatized or coated surfaces, to enhance their utility in the microfluidic system, e.g., provide enhanced fluid direction, e.g., as described in U.S. patent application Ser. No. 08/843,212, filed Apr. 14, 1997, and which is incorporated herein by reference in its entirety for all purposes.

The channels and/or chambers of the microfluidic devices are typically fabricated into the upper surface of the bottom substrate or portion 12, as microscale grooves or indentations 16, using the above described microfabrication techniques. The top portion or substrate 18 also comprises a first planar surface 20, and a second surface 22 opposite the first planar surface 20. In the microfluidic devices prepared in accordance with the methods described herein, the top portion also includes a plurality of apertures, holes or ports 24 disposed therethrough, e.g., from the first planar surface 20 to the second surface 22 opposite the first planar surface.

The first planar surface 20 of the top substrate 18 is then mated, e.g., placed into contact with, and bonded to the planar surface 14 of the bottom substrate 12, covering and sealing the grooves and/or indentations 16 in the surface of the bottom substrate, to form the channels and/or chambers (i.e., the interior portion) of the device at the interface of these two components. The holes 24 in the top portion of the device are oriented such that they are in communication with at least one of the channels and/or chambers formed in the interior portion of the device from the grooves or indentations in the bottom substrate. In the completed device, these holes function as reservoirs for facilitating fluid or material introduction into the channels or chambers of the interior portion of the device, as well as providing ports at which electrodes may be placed into contact with fluids within the device, allowing application of electric fields along the channels of the device to control and direct fluid transport within the device.

Conditions under which substrates may be bonded together are generally widely understood, and such bonding of substrates is generally carried out by any of a number of methods, which may vary depending upon the nature of the substrate materials used. For example, thermal bonding of substrates may be applied to a number of substrate materials, including, e.g., glass or silica based substrates, as well as polymer based substrates. Such thermal bonding typically comprises mating together the substrates that are to be bonded, under conditions of elevated temperature and, in some cases, application of external pressure. The precise temperatures and pressures will generally vary depending upon the nature of the substrate materials used.

For example, for silica-based substrate materials, i.e., glass (borosilicate glass, Pyrex™, soda lime glass, etc.), quartz, and the like, thermal bonding of substrates is typically carried out at temperatures ranging from about 500° C. to about 1400° C., and preferably, from about 500° C. to about 1200° C. For example, soda lime glass is typically bonded at temperatures around 550° C., whereas borosilicate glass typically is thermally bonded at or near 800° C. Quartz substrates, on the other hand, are typically thermally bonded at temperatures at or near 1200° C. These bonding temperatures are typically achieved by placing the substrates to be bonded into high temperature annealing ovens. These ovens are generally commercially available from, e.g., Fischer Scientific, Inc., and LabLine, Inc.

Polymeric substrates that are thermally bonded, on the other hand, will typically utilize lower temperatures and/or pressures than silica-based substrates, in order to prevent excessive melting of the substrates and/or distortion, e.g., flattening of the interior portion of the device, i.e., channels or chambers. Generally, such elevated temperatures for bonding polymeric substrates will vary from about 80° C. to about 200° C., depending upon the polymeric material used, and will preferably be between about 90° C. and 150° C. Because of the significantly reduced temperatures required for bonding polymeric substrates, such bonding may typically be carried out without the need for high temperature ovens, as used in the bonding of silica-based substrates. This allows incorporation of a heat source within a single integrated bonding system, as described in greater detail below.

Adhesives may also be used to bond substrates together according to well known methods, which typically comprise applying a layer of adhesive between the substrates that are to be bonded and pressing them together until the adhesive sets. A variety of adhesives may be used in accordance with these methods, including, e.g., UV curable adhesives, that are commercially available. Alternative methods may also be used to bond substrates together in accordance with the present invention, including e.g., acoustic or ultrasonic welding and/or solvent welding of polymeric parts.

Figure 4:
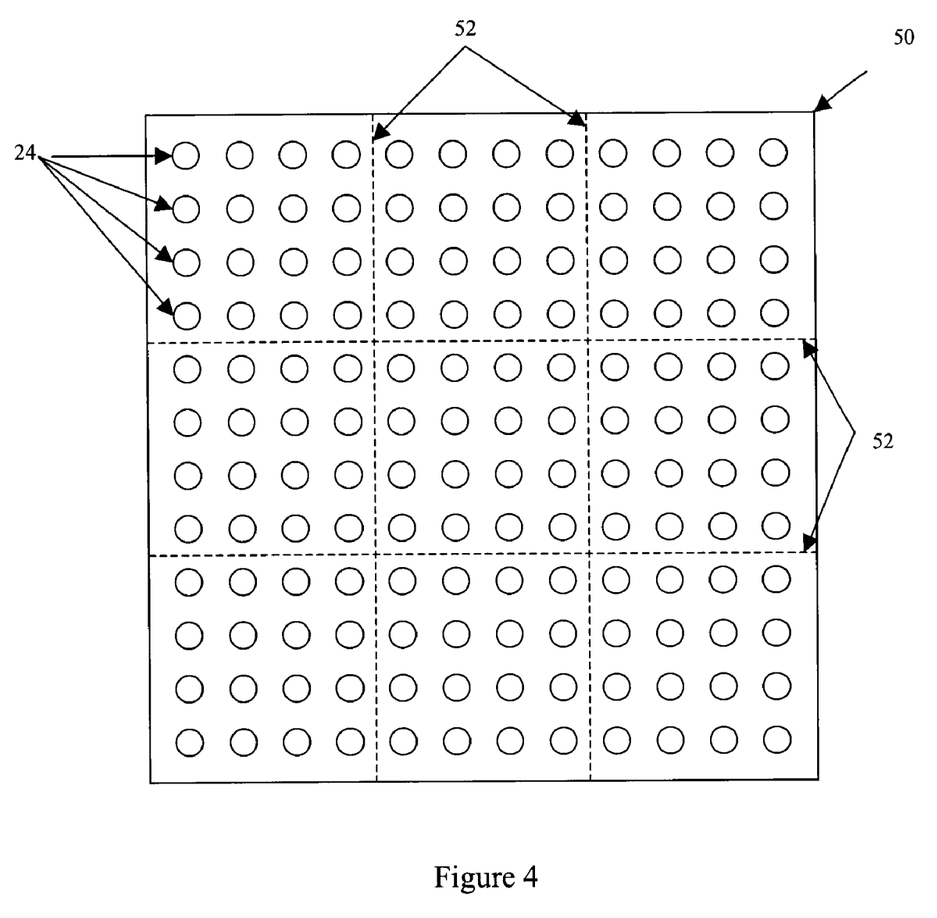
FIG. 4 illustrates a bonded substrate that includes multiple discrete channel networks to be separated into individual microfluidic devices.

Typically, a number of microfabricated devices will be manufactured at a time. For example, polymeric substrates may be stamped or molded in large separable sheets which can be mated and bonded together. Individual devices or discrete channel networks may then be separated from the larger bonded substrate sheet. Similarly, for silica-based substrates, individual devices can be fabricated from larger substrate wafers or plates, allowing higher throughput of the manufacturing process. Specifically, a number of discrete channel networks, e.g., where each separate channel network includes at least two intersecting channels, can be manufactured into a first substrate wafer or plate. A second wafer or plate is then provided that includes a plurality of holes disposed through it, which holes align with the unintersected termini of the various channel networks. The two substrate wafers are first bonded together such that multiple channel networks are created in the integrated substrate. The resulting multiple devices are then segmented from the larger substrates using known methods, such as sawing (See, e.g., U.S. Pat. No. 4,016,855 to Mimata, incorporated herein by reference), scribing and breaking (See Published PCT Application No. WO 95/33846), and the like. In particular, a large bonded substrate including multiple separate and discrete channel networks is separated into individual devices by, e.g., sawing them apart, scribing between the channel networks and breaking them apart. In the case of polymeric substrates these methods are also as applicable, however, discrete devices may be cut or melted apart. In some cases, where the fabrication process has included perforations or thinner areas of the bonded substrates, the discrete devices may be simply snapped or broken apart. An example of this fabrication method is schematically illustrated in FIG. 4. As shown, the bonded substrate (seen only from above) includes the apertures 24 as described with reference to FIG. 1. These apertures are in fluid communication with discrete channel networks (not shown) in the interior portion of the bonded substrate 50. The discrete channel networks or individual microfluidic devices are then separated from the larger sheet along, e.g., dashed lines 52. Depending upon the method employed, these dashed lines may be the lines along which sawing or scribing and breaking take place, or they can include perforated regions or thinned substrate regions which may be easily broken apart.

Typically, these larger wafer techniques may be used to simultaneously fabricate at least 4 separate microfluidic devices, e.g., as discrete channel networks in the larger wafer, typically at least 8 separate devices, preferably at least than 10 separate devices, more preferably at least 20 separate devices and still more preferably, at least 40 separate devices from a single bonded substrate.

As noted above, the top or second substrate is overlaid upon the bottom or first substrate to seal the various channels and chambers. In carrying out the bonding process according to the methods of the present invention, the mating of the first and second substrates is carried out using vacuum to maintain the two substrate surfaces in optimal contact. In particular, the bottom substrate may be maintained in optimal contact with the top substrate by mating the planar surface of the bottom substrate with the planar surface of the top substrate, and applying a vacuum through the holes that are disposed through the top substrate. Typically, application of a vacuum to the holes in the top substrate is carried out by placing the top substrate on a vacuum chuck, which typically comprises a mounting table or surface, having an integrated vacuum source. In the case of silica-based substrates, the mated substrates are subjected to elevated temperatures, e.g., in the range of from about 100° C. to about 200° C., in order to create an initial bond, so that the mated substrates may then be transferred to the annealing oven, without any shifting relative to each other.

Figure 2:
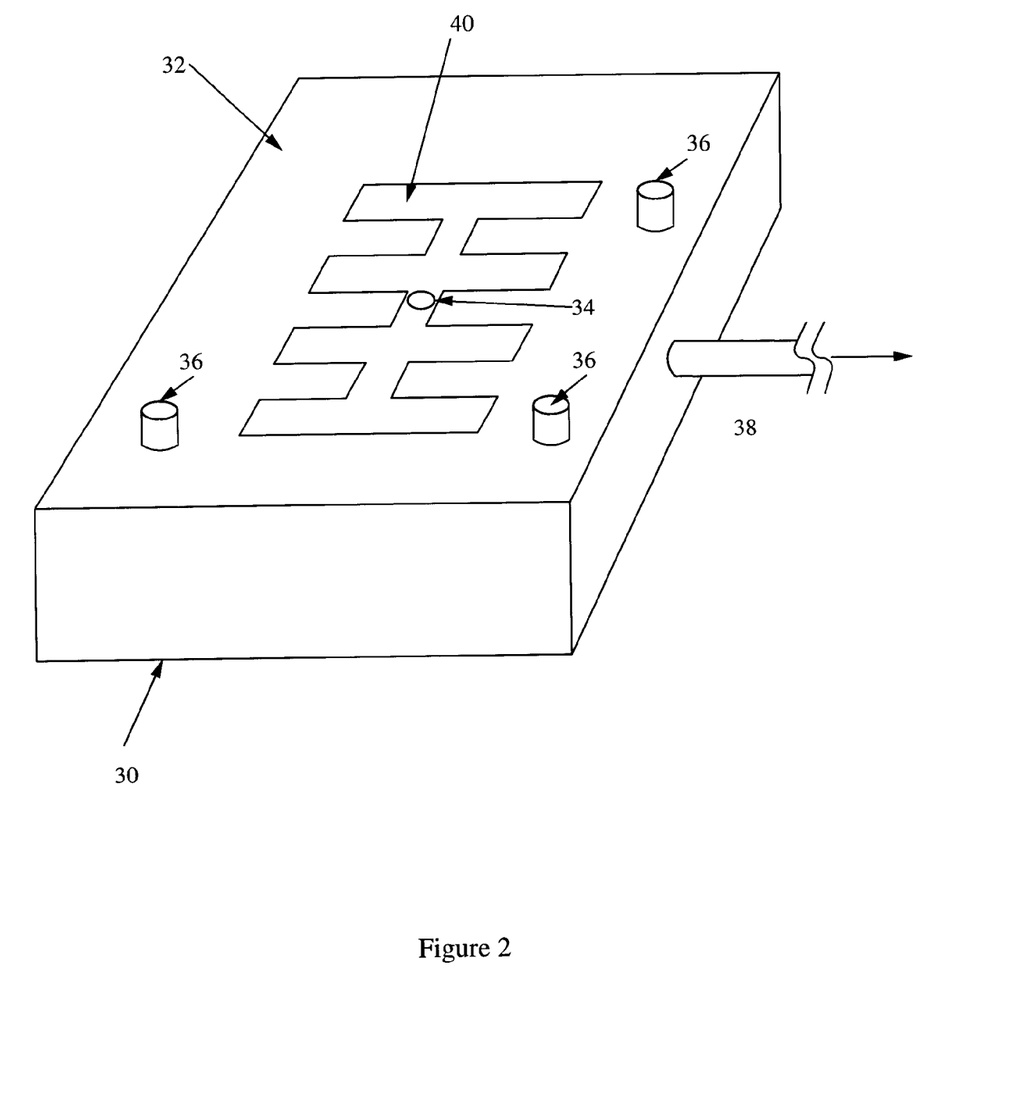
FIG. 2 illustrates a mounting table and vacuum chuck for bonding substrates together according to the methods of the present invention.

One example of an apparatus for use in accordance with the methods described herein is shown in FIG. 2. As shown, the apparatus includes a mounting table 30, which comprises a platform surface 32, having a vacuum port 34 disposed therethrough. In operation, the top substrate, e.g., having the plurality of holes disposed therethrough, is placed upon the platform surface and maintained in contact with that surface by virtue of the application of a vacuum through vacuum port 34. Although FIG. 2 shows the platform surface as being the upper surface of the mounting table, it will be appreciated that such a device would also function in an inverted orientation, relying upon the applied vacuum to maintain the substrate in contact with the platform surface. The platform may also comprise one or more alignment structures for maintaining the substrate in a set, predefined position. These alignment structures may take a variety of forms, including, e.g., alignment pins 36, alignment ridges, walls, or wells disposed upon the mounting surface, whereupon placement of the substrates in accordance with such structures ensures alignment of the substrates in the appropriate position, e.g., over the vacuum port, as well as aligning the individual substrate portions with other substrate portions, as described in greater detail below. In addition to such structures, alignment may also be facilitated by providing the platform at an appropriate angle, such that gravity will maintain the substrate in contact with the alignment structures. Vacuum port 34 is disposed through the platform surface and mounting table, and is connected via a vacuum line 38 to a vacuum source (not shown), e.g., a vacuum pump.

The first substrate is placed upon the platform surface such that the planar surface of the top substrate faces away from the platform surface of the mounting table, and such that the holes in the substrate are in communication with the vacuum port in the platform surface of the mounting table. Alignment of the holes over the vacuum port is typically accomplished through the incorporation of alignment structure or structures upon the mounting table platform surface, as described above. In order to apply vacuum simultaneously at a plurality of the holes in the top substrate, a series of vacuum ports may be provided through the platform surface. Preferably, however, the platform surface comprises a series of grooves 40 fabricated therein, and extending outward from a single vacuum port, such that each of the plurality of holes in the top substrate will be in communication with the vacuum port via at least one of these grooves or "vacuum passages," when the top substrate is placed upon the platform surface.

The bottom substrate, also having a first planar surface, is then placed on the top substrate such that the first planar surface of the bottom substrate mates with that of the top substrate. Again, the alignment structures present upon the platform surface will typically operate to align the bottom substrate with the top substrate as well as maintain the substrates over the vacuum port(s). The alignment of the various substrate portions relative to each other is particularly important in the manufacture of microfluidic devices, wherein each substrate portion may include microfabricated elements which must be in fluid communication with other microfabricated elements on another substrate portion.

A vacuum is then applied through the vacuum passages on the platform surface, and to the holes through the top substrate. This acts to pull the two substrates together by evacuating the air between their planar surfaces. This method is particularly useful where the top and bottom substrates are elements of microfluidic devices, as described above. Specifically, upon mating the top substrate with the bottom substrate, the holes disposed through the top substrate will generally be in communication with the intersecting channel structures fabricated into the planar surface of the bottom substrate. In these methods, the channel networks enhance the efficiency of the bonding process. For example, these channel networks typically cover large areas of the surface of the bottom substrate, or the space between the two substrates. As such, they can enhance the efficiency with which air is evacuated from this space between the two substrates, ensuring sufficient contact between the substrates over most of the planar surfaces of the two substrates for bonding. This is particularly the case for those areas between the substrates that are immediately adjacent the channel structures, where complete bonding is more critical, in order to properly seal these channels.

In addition to more efficiently removing air from between the substrates, the application of vacuum at each of the plurality of holes in the top substrate, as well as through the intersecting channel structures between the two substrates results in a more even application of the pressure forcing the substrates together. Specifically, unevenly applied pressures in bonding methods can have substantial adverse effects on the bonding process. For example, uneven application of pressures on the two substrates during the bonding process can result in uneven contact between the two surfaces of the two substrates, which, as described above, can reduce the efficiency and quality, as well as the effective product yield of the bonding process.

Further, even where substrates are completely bonded under such uneven pressure, e.g., for thermally bonded polymeric substrates or substrates bonded with adhesives, such uneven pressures can result in variations in the dimensions of the internal structures of the device from one location in a microfabricated device to another. Again, the channel networks extending across wide areas of the interior portion of the two substrates, e.g., fabricated into the surface of the second substrate, allows application of vacuum across a substantially larger, and more evenly distributed area of the substrates interior portion.

Figure 3:
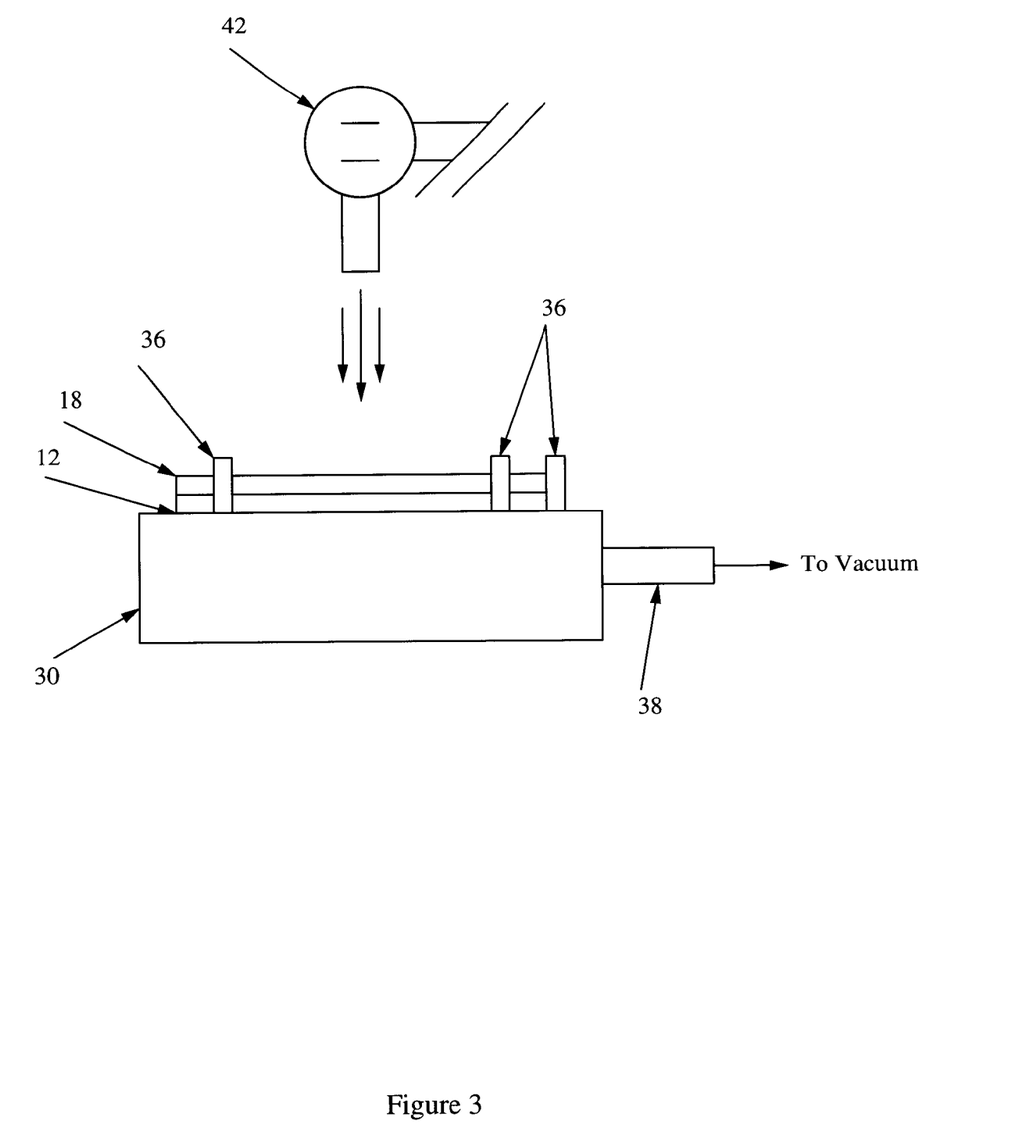
FIG. 3 illustrates an apparatus for mounting and thermally bonding substrates together.

In addition to the vacuum chuck, the bonding system shown in FIG. 3 also includes a heat source, e.g., a controllable heat source such as heat gun 42, for elevating the temperature of the substrates 12 and 18 while they are mounted on the platform surface/mounting table 30. For bonding silica based substrates, this heat source applies an elevated temperature to the two substrates to create a preliminary bond between the substrates, so that they can be readily transferred to an annealing oven without the substrates shifting substantially relative to each other. This is generally accomplished by heating the two substrates to between about 90° C. and about 200° C. In the case of polymeric substrates, this heat source can take the place of the annealing oven by elevating the temperature of the polymeric substrates to appropriate bonding temperatures, e.g., between about 80° C. and 200° C. Further, this can be done while the substrates are mounted upon the mounting table, and while a vacuum is being applied to the substrates. This has the effect of maintaining an even, constant pressure on the substrates throughout the bonding process. Following such initial bonding, the substrates are transferred to an annealing oven, e.g., as described above, where they are subjected to bonding temperatures between about 500° C. and 1400° C., again, as described above.

Although illustrated in FIG. 3 as a heat gun, it will be readily appreciated that the heat source portion of the apparatus may include multiple heat sources, i.e., heat guns, or may include heating elements integrated into the apparatus itself. For example, a thermoelectric heater may be fabricated into or placed in thermal contact with the platform surface/mounting table 30, which itself, may be fabricated from a thermally conductive material. Such thermal bonding systems are equally applicable to both polymeric substrates and silica based substrates, e.g., for overall bonding of polymeric substrates, or for producing the initial, preliminary bonding of the silica-based substrates.

Alternate bonding systems for incorporation with the apparatus described herein include, e.g., adhesive dispensing systems, for applying adhesive layers between the two planar surfaces of the substrates. This may be done by applying the adhesive layer prior to mating the substrates, or by placing an amount of the adhesive at one edge of the adjoining substrates, and allowing the wicking action of the two mated substrates to draw the adhesive across the space between the two substrates.

In certain embodiments, the overall bonding system can include automatable systems for placing the top and bottom substrates on the mounting surface and aligning them for subsequent bonding. Typically, such systems include translation systems for moving either the mounting surface or one or more of the top and bottom substrates relative to each other. For example, robotic systems may be used to lift, translate and place each of the top and bottom substrates upon the mounting table, and within the alignment structures, in turn. Following the bonding process, such systems also can remove the finished product from the mounting surface and transfer these mated substrates to a subsequent operation, e.g., separation operation, annealing oven for silica-based substrates, etc., prior to placing additional substrates thereon for bonding.

Although the present invention has been described in some detail by way of illustration and example for purposes of clarity and understanding, it will be apparent that certain changes and modifications may be practiced within the scope of the appended claims. All publications, patents and patent applications referenced herein are hereby incorporated by reference in their entirety for all purposes as if each such publication, patent or patent application had been individually indicated to be incorporated by reference.

What is claimed is:

1. A method of fabricating microfluidic devices, comprising:

providing a first substrate having a first surface and a plurality of discrete groove networks disposed on the first surface, each of the plurality of discrete groove networks comprising at least two intersecting grooves;

bonding a second substrate to the first surface of the first substrate, wherein the second substrate comprises a plurality of apertures disposed through it from a first surface of the second substrate to a second surface of the second substrate, said bonding comprising first applying a vacuum to said apertures and mating the second substrate with the first surface of the first substrate to create a bonded substrate wherein the intersecting grooves are sealed to produce a plurality of discrete channel networks, the plurality of apertures being positioned in the second substrate to be in fluid communication with the discrete channel networks; and separating a first portion of the bonded substrate containing at least a first discrete channel network from a second portion of the bonded substrate containing at least a second discrete channel network.

2. The method of claim 1, wherein the bonding step comprises heating the first and second substrates to bond the first surface of the first substrate to the first surface of the second substrate.

3. The method of claim 2, wherein the first and second substrates comprise silica-based substrates, and wherein the bonding step comprises heating the first and second substrates to between about 90 and 200° C., followed by the step of heating the first and second substrates to a temperature between about 500° C. and 1400° C.

4. The method of claim 2, wherein the step of heating the substrates comprises heating the first and second substrates to a temperature between about 80° C. and 200° C.

5. The method of claim 4, wherein the first and second substrates comprise polymeric substrates.

6. The method of claim 1, wherein the bonding step comprises the step of applying an adhesive to at least one of the first surface of the first substrate or the first surface of the second substrate prior to mating the first surface of the first substrate of the first surface of the second substrate.

7. The method of claim 1, wherein the first and second substrates comprise glass.

8. The method of claim 1, wherein the first and second substrates are comprised of polymeric materials.

9. The method of claim 1, wherein the plurality of the discrete channel networks comprises at least 4 discrete channel networks.

10. The method of claim 1, wherein the plurality of discrete channel networks comprises at least 8 discrete channel networks.

11. The method of claim 1, wherein the plurality of discrete channel networks comprises at least 10 discrete channel networks.

12. The method of claim 1, wherein the plurality of discrete channel networks comprises at least 20 discrete channel networks.

13. The method of claim 1, wherein the plurality of discrete channel networks comprises at least 40 discrete channel networks.

14. The method of claim 1, wherein the bonded substrate from the bonding step comprises a thinned region between the discrete channel networks, and the separating step comprises breaking the first channel network from at least the second channel network along the thinned region.

15. The method of claim 1, wherein the bonded substrate from the bonding step comprises a perforated region between the discrete channel networks, and the separating step comprises breaking the first channel network from at least the second channel network along the perforated region.

16. The method of claim 1, wherein the first portion of the bonded substrate is separated from the second portion of the bonded substrate by scribing between the first and second portions and breaking the first and second portions apart.

17. The method of claim 1, wherein the first portion of the bonded substrate is separated from the second portion of the bonded substrate by sawing the first and second portions apart.

* * * * *